United States Patent [19]

De Loach, Jr. et al.

[11] 4,429,231

[45] Jan. 31, 1984

[54] OPTICAL SYSTEM FOR INTERROGATION OF THE STATUS OF A SWITCH

[75] Inventors: Bernard C. De Loach, Jr., New Providence; Richard C. Miller, Summit; Bertram Schwartz, Westfield, all of N.J.

[73] Assignee: Bell Telephone Laboratories, Incorporated, Murray Hill, N.J.

[21] Appl. No.: 324,802

[22] Filed: Nov. 25, 1981

[51] Int. Cl.³ .............................................. G02B 27/00
[52] U.S. Cl. ..................................... 250/551; 250/227
[58] Field of Search ............... 250/551, 226, 227, 363, 250/365; 357/19; 455/602, 603, 605, 612, 617

[56] References Cited

U.S. PATENT DOCUMENTS 4,202,000  5/1980  Carballes ............................. 357/19
4,286,171  8/1981  Hara et al. ........................... 250/551

OTHER PUBLICATIONS

S. Larach, ed., "Photoelectronic Materials and Devices", pp. 6, 280–283, 1965.

*Primary Examiner*—David C. Nelms
*Attorney, Agent, or Firm*—David I. Caplan

[57] ABSTRACT

A system (FIG. 1) for interrogating the ON-OFF status of an electrical switch (31) comprises a semiconductor body (4) containing a PN junction and means (5) for electrically connecting an auxiliary switch (32) coupled to the interrogated switch, or alternately (FIG. 2) the interrogated switch (32), across the PN junction. Light (7) of a first wavelength incident on the semiconductor body causes light of a second wavelength (11) to be emitted from the body when the switch is open (OFF), whereas no light is emitted from the body when the switch is closed (ON). Therefore, photoelectric detection of the emission vs. non-emission of light of the second wavelength from the semiconductor body indicates the OFF vs. ON status of the switch.

8 Claims, 2 Drawing Figures

OPTICAL SYSTEM FOR INTERROGATION OF THE STATUS OF A SWITCH

FIELD OF THE INVENTION

This invention relates to optical systems and more particularly to optical systems for interrogating the ON-OFF condition of a switch.

BACKGROUND OF THE INVENTION

In electrical and mechanical systems, it is often desirable to know whether a switch—typically an electrical switch located somewhere within the system, usually at a customer location—is in an open or closed condition. By the term "switch" is meant any electrical or mechanical means for obtaining a switching function. A "mechanical switch" includes any physical object which can be moved into a predetermined position. An "electrical switch" includes any means forming an electrical path which can be altered (switched) from or to a short circuit (ON) to or from an open circuit (OFF). Electrical switches include electronic and electro-mechanical types of switches. Examples include not only a conventional electrical switch, such as an electronic transistor or a mechanical wall switch, but also, for example, a wire which can be broken or cut and an electrical path in electrically conducting equipment or machinery which, due to mechanical movement, alternately opens and closes.

It is desirable to be able to determine (or interrogate), typically at a remote central office, the open vs. closed (OFF vs. ON) condition of the switch. As complete optical communication systems are developed in the art and put into commercial use, electrical lines (links) between the central office and any other part of the system, such as the customer location, may not be available for such interrogation, and it would be expensive to provide such electrical lines. The optical fiber links in these optical systems, as well known, have many advantages over electrical lines, such as strength and small size, and are particularly advantageous in certain corrosive or explosive environments where electrical wires are hazardous. Moreover, in an environment of electrical noise caused by switching equipment, motors, and so forth, where electrical interference can be a problem, it is desirable to have a nonelectrical link from a central location to a remote location for switch interrogation connections.

SUMMARY OF THE INVENTION

An optical system for interrogation of the ON-OFF condition of a switch comprises a semiconductor body containing a PN junction. Coupled to the semiconductor body is electrically conductive means for electrically connecting across the PN junction an electrical switch having a closed (ON) and an open (OFF) condition. The switch and the conductive means for connecting the switch form essentially a short circuit across the junction when the switch is closed, but an open circuit when the switch is open. The semiconductor body, irradiated with incident light of a first wavelength $\lambda_1$, responds to the radiation by emitting a substantial amount of light (photoluminescence) of a second wavelength $\lambda_2$, (different from the first wavelength) when the switch is open (OFF), but by emitting little or no light when the switch is closed (ON). Light of the second wavelength, if any, emitted from the body is optically coupled, as by an optical fiber, to photoelectric means for indicating the OFF vs. ON status of the switch by detection of the presence vs. absence of light of the second wavelength.

It is believed that the system operates as follows: When the switch is open (OFF) there is no closed circuit path through which charge carriers generated by the incident light $\lambda_1$ can pass out of the body, so these charge carriers are then available for recombination and generation of the emitted light $\lambda_2$; conversely, when the switch is closed (ON) these charge carriers can pass out of the body and are thus not available for generation of the light $\lambda_2$.

In a specific embodiment, at a customer location is located a primary electrical switch (to be interrogated) mechanically coupled to an auxiliary, secondary electrical switch, the primary switch being part of a primary electrical circuit which is being utilized in customer equipment. The switches are coupled ("ganged") such that the controlled terminals of the secondary switch are electrically isolated from the primary circuit. The connecting means—for example, wiring—coupled to the semiconductor body is then adapted for electrically connecting the controlled terminals of the secondary switch across the PN junction. The semiconductor body is thus isolated from the primary circuit, in order that primary circuit currents and voltages should not affect the voltage across the PN junction. At a central location remote from the customer location, a source of light of a first wavelength $\lambda_1$ and a photodetector are coupled to a first end of a principal optical fiber by means of a bi-directional optical coupler. A second end of the fiber at the remote customer location is optically coupled to the semiconductor body. Therefore, the light $\lambda_1$ is transmitted by the fiber from the light source at the central location to the semiconductor body at the remote location; the light, if any, of the second wavelength $\lambda_2$ emitted from the semiconductor body is transmitted in the opposite direction by the fiber back to the central location, where the light $\lambda_2$ is coupled to and detected by the photodetector.

In another embodiment, the switch to be interrogated comprises electrically conducting moving parts of mechanical equipment, or simply a breakable wire such as in a burglar alarm system. The connecting means is then wiring adapted for connecting this switch across the PN junction.

Since in accordance with the invention only an optical connection (such as furnished by an optical fiber) but no electrical connection is needed between the (remote) location of the switch to be interrogated and the (central) location of the photoelectric detection means, the condition of the switch can be monitored from a central location using systems or equipment containing no electrical interconnections between the central and the remote locations. This purely optically coupled remote monitoring capability will be especially valuable where human access to the switch being monitored (continuously interrogated) is difficult or undesirable, such as radioactive environments or customer locations in private homes.

BRIEF DESCRIPTION OF THE DRAWING

The Figures illustrate specific embodiments of the invention as described in the detailed description.

DETAILED DESCRIPTION

Figure 1:
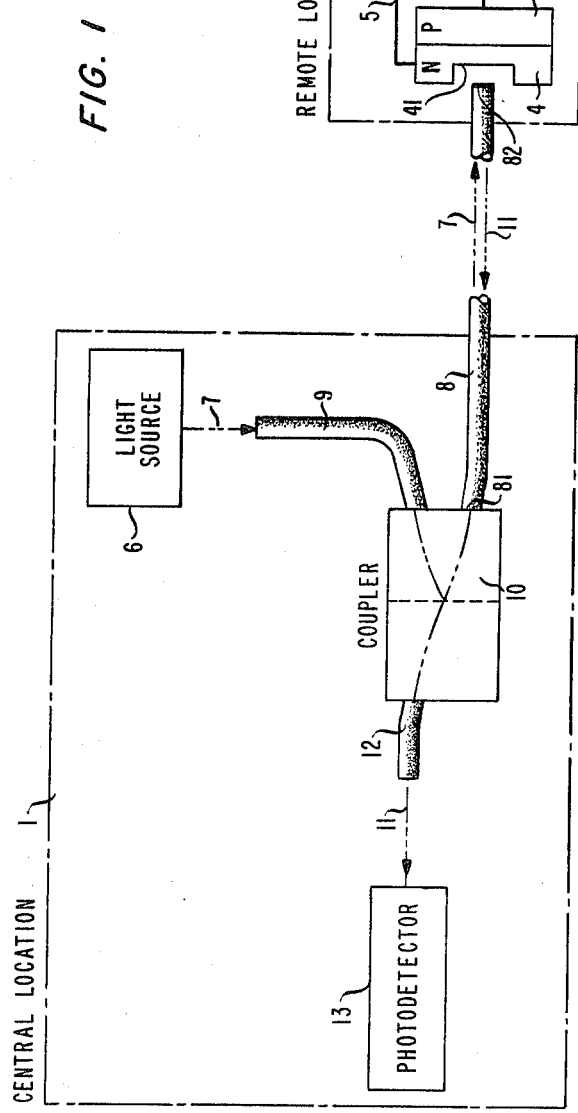
FIG. 1 illustrates a system for interrogating from a central office the status of a remote switch at a customer location, in accordance with the invention.

As shown in FIG. 1, a system for remote interrogation of the status of a switch includes a central location 1 and a remote customer location 2 where a primary customer-controlled switch 31 (to be interrogated) is located. The remote location 2 includes a semiconductor body 4 containing a PN junction. Across the junction is an electrically conductive means 5 for connecting a secondary electrical switch 32 typically mechanically ganged by control means 3 to the customer-controlled primary interrogated switch 31. The primary switch 31 is typically connected in series with an electrical load 33 and power supply 34 (but alternatively may comprise a nonelectrical switch in nonelectrical customer equipment). The switch 31 and load 33 typically are located at the remote location, whereas the power supply is typically removed from the remote location (but alternatively may be located at the remote location).

A typically monochromatic light source 6 is located in the central location 1 remote from the semiconductor body 4. The light source 6 emits a light beam 7 of a first wavelength $\lambda_1$ coupled by a first optical fiber 9 to a bi-directional coupler 10. The coupler 10 couples the light $\lambda_1$ into a first end 81 of a second, principal optical fiber 8 which transmits the light $\lambda_1$ to the other, second end 82 of the principal fiber proximate to the semiconductor body 4 at the remote location 2. The light $\lambda_1$ propagating from the light source 6 at the central location is thus transmitted to the second end 82 of the principal fiber 8 at the remote customer location where most of the light $\lambda_1$ exits the principal fiber 8 and strikes a proximate surface 41 of the body 4. A small portion of light $\lambda_1$ ordinarily is reflected back into the fiber 8 from the second end 82 of the fiber. The first wavelength $\lambda_1$ is shorter than a second wavelength $\lambda_2$ emitted from the semiconductor body in response to incidence thereon of the first wavelength $\lambda_1$, the wavelength $\lambda_2$ emitted by the semiconductor body typically corresponding to approximately the band gap energy $E_B$ of the semiconductor material ($\lambda_2 = hc/E_B$, where h is Planck's constant and c is the vacuum speed of light). The body 4 emits a substantial amount of light $\lambda_2$ only when the electrical switch 32 is open (OFF), but emits a comparatively negligible amount when the switch 32 is closed (ON). This light $\lambda_2$, if any, is optically coupled from the semiconductor body 4 to the second end 82 of the principal fiber 8. The second end 82 of the fiber and the surface 41 of the diode 4 are coated by an antireflection coating for suppressing reflections of light of both wavelengths $\lambda_1$ and $\lambda_2$ in order to avoid spurious $\lambda_1$ reflections and to improve the $\lambda_2$ coupling efficiency. Thus, essentially all of the light of the second wavelength $\lambda_2$ incident on the coating is coupled into the fiber 8 and transmitted by the fiber 8 to the central location. The light $\lambda_2$, indicated in FIG. 1 by a beam 11, is then coupled from the first end 81 of the principal fiber by the coupler 10 to the third fiber 12. Essentially all of the light $\lambda_1$ reflected back from the second end 82 of the body 4 is directed away from the third fiber 12 by the coupler 10. The third fiber 12 transmits the light $\lambda_2$ to a photodetector 13 located at the cental location and situated proximate to the end of the fiber 12. The light $\lambda_2$ then exits the third fiber 12 and strikes the photodetector 13. Light of wavelength $\lambda_2$ emitted from the semiconductor body at the remote location is thus detected by the photodetector at the central location. Therefore, when the ganged switches 31 and 32 at the remote location 2 are closed, little or no light of wavelength $\lambda_2$ is detected at the central location 1 by the photodetector; but when the switches 31 and 32 are open, a substantial amount of light of wavelength $\lambda_2$ is detected by the photodetector.

Figure 2:
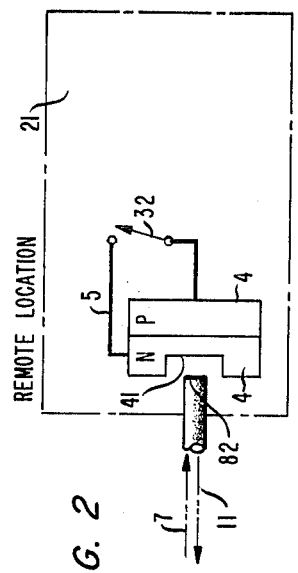
FIG. 2 illustrates a portion of an alternative system to the embodiment in FIG. 1 for interrogating a remote electrical switch in accordance with another embodiment of the invention.

Alternatively at another remote location 21, as shown in FIG. 2, the secondary switch 32 is also the primary interrogated switch and is part of a burglar alarm system. The connection means 5 comprises wires inside the walls of a room (not shown), the wires being joined by means of an electrical path across an entrance to the room, such as a door or a window. The electrical path across the entrance serves as the secondary interrogated switch 32, and is connected across the PN junction by the connection means (wires) 5. When and only when the door (or window) forming the switch 32 is open, light $\lambda_2$ is then emitted from the semiconductor body 4 in response to incidence thereon of the light $\lambda_1$.

More specifically, by way of illustration only, the system shown in FIG. 1 includes a GaAs laser 6 as the light source containing approximately eight percent aluminum in its active region and emitting the light beam 7 of wavelength $\lambda_1$ of about 0.82 micron. In the central office 1, the laser beam 7 is coupled by means of the first, multimode optical fiber 9 to a GRIN-lens (graded refractive index lens) bi-directional coupler 10 which reflects the beam 7 into the first end 81 of the second, multimode optical fiber 8. Each fiber is typically graded-index with a numerical aperture of 0.2 and a core diameter of 50 microns. The fiber 8 transmits the light $\lambda_1$ to the remote customer location 2 where the light $\lambda_1$ exits the fiber 8 at the second, customer end 82 of the fiber and is incident upon a photoluminescent Burrus-type or other photoluminescent semiconductor doide (typically having an etched optical coupling well) serving as the body 4. For example, the body 4 can take the form of a double heterostructure as described in a paper by R. C. Miller et al., entitled "A High-Efficiency GaAlAs Double-Heterostructure Photovoltaic Detector," published in *Applied Physics Letters*, Vol. 33, pp. 721-723 (1978). Only when the secondary switch 32 is open is light of wavelength $\lambda_2$ of about 0.88 micron emitted from the photoluminescent diode and coupled into the fiber 8, by which fiber the light $\lambda_2$ is transmitted to the central office 1. At the central office, the bi-directional coupler couples the light $\lambda_2$ from the first end 81 of the fiber 8 into the third, multi-mode fiber 12 similar in cross section to the fibers 8 and 9. The light $\lambda_2$ is coupled by the fiber 12 to a GaAs avalanche photodetector (APD) serving as the detector 13.

In any event, the semiconductor body 4 is advantageously arranged such that a major portion of the incident light $\lambda_1$ from the second end 82 of the fiber 8 penetrates to and is absorbed in an "active region" of the semiconductor, i.e., in a semiconductor zone contiguous with the PN junction, and in the case of heterostructures advantageously in the narrower band-gap material contiguous with the PN junction.

Although this invention has been described in detail with respect to a specific embodiment, the invention is also accomplished with various modifications.

For example, a pair of transistors serving as the switches 31 and 32 in the embodiment in FIG. 1 also provides electrical isolation between the primary customer circuit and the PN junction. The control terminals (bases of bipolar, gate electrodes of either junction or MOS field effect transistor) of both transistors are connected to the same electrical node, serving as the coupling means 3, controlled by the customer, which coupling allows simultaneous control of the pair of switches 31 and 32. The coupling means typically causes both switches to be ON at the same time and OFF at the same time; however, alternately the secondary switch is turned OFF (or ON) when the primary switch is turned ON (or OFF), as for example when the gate connections of a p-channel MOS transistor and an n-channel MOS transistor are connected to the same electrical node. The conductive means 5 for the secondary switch 32 is thus adapted to electrically connect across the PN junction the controlled terminals (source and drain) of the transistor serving as the secondary switch 32.

In another example, the invention utilizes an existing optical link, such as a fiber in an optical telephone system, between the central and remote locations. A portion of the telephone signal, which signal modulates light of the first wavelength $\lambda_1$, is tapped from the fiber at the remote location and coupled to the semiconductor body. The light $\lambda_2$ emitted from the body in response to $\lambda_1$ when the secondary switch is open is coupled back into the fiber and transmitted to the central location where the light $\lambda_2$ is separated (by means of an optical directional coupling device) from the telephone carrier $\lambda_1$ and coupled to the photodetector.

Alternately, an existing optical telephone fiber is used as a means for transmitting the light beams $\lambda_1$ and $\lambda_2$ for interrogating the switch, both $\lambda_1$ and $\lambda_2$ being different from a telephone signal carrier $\lambda_3$. Suitable optical coupling devices are then located at both the central and the remote locations for separating the interrogation signals ($\lambda_1,\lambda_2$) from the telephone signal carrier $\lambda_3$ transmitted by the telephone fiber.

In other modifications of the invention, the remote location need not be a distant customer location, but only need be electrically isolated from the photoelectric detection means at the central location. The central and electrically isolated locations can be located in the same factory or piece of equipment. For example, in a factory the secondary interrogated switch (FIG. 2) comprises electrically conducting moving equipment having a cycle of movement controlled by a computer. During a portion of the cycle, the machinery forms a short circuit (the switch closes), thereby causing the photoelectric means to generate a feedback signal to the computer.

In various other modifications of the invention, the connection means 5 are not limited to connecting a single electrical switch across the PN junction, but can also connect two or more electrical switches in series across the junction. As an example, in a burglar alarm system an electrical path through a door and another through a window are connected in series by wires (connection means 5), thus forming two secondary interrogated switches connected in series across the PN junction.

What is claimed is:

1. A system for interrogating the ON-OFF condition of an electrical switch comprising:
   (a) a semiconductor body containing a PN junction;
   (b) electrically conductive connection means adapted for connecting the electrical switch across the PN junction;
   (c) a source of optical radiation of a first wavelength optically coupled to the semiconductor body; and
   (d) photoelectric means, optically coupled to the semiconductor body, for discriminating and detecting radiation of a second wavelength, a substantial amount of the radiation of the second wavelength being emitted from the semiconductor body in response to incidence thereon of the first wavelength when the electrical switch is in the OFF condition, but not emitted when the switch is in the ON condition.

2. A system comprising:
   (a) a semiconductor body containing a PN junction;
   (b) an electrical switch having an ON and an OFF condition;
   (c) electrically conductive connection means connecting the electrical switch across the PN junction;
   (d) a source of optical radiation of a first wavelength optically coupled to the semiconductor body; and
   (e) photoelectric means, optically coupled to the semiconductor body, for discriminating and detecting radiation of a second wavelength, a substantial amount of the radiation of the second wavelength being emitted from the semiconductor body in response to incidence thereon of the first wavelength when the electrical switch is in the OFF condition, but not emitted when the switch is in the ON condition.

3. The system of claim 1 or claim 2 in which the photoelectric means is located at a central location and the semiconductor body is located at a separate location physically remote from the central location.

4. A system for interrogating the ON-OFF condition of an electrical switch comprising:
   (a) a semiconductor body containing a PN junction;
   (b) electrically conductive connection means adapted for connecting the electrical switch across the PN junction;
   (c) a source of optical radiation of a first wavelength;
   (d) a principal optical fiber having a first end optically coupled to the source by means of a bidirectional optical coupling device, the fiber having a second end optically coupled to the semiconductor body, whereby the fiber and coupling device couple radiation of the first wavelength from the source to the semiconductor body; and
   (e) a photodetector for detecting light of a second wavelength emitted by the semiconductor body, the photodetector being coupled to the first end of the fiber by means of the coupling device such that radiation of the second wavelength is coupled from the semiconductor body to the photodetector.

5. A system comprising:
   (a) a semiconductor body containing a PN junction;
   (b) an electrical switch having an ON and an OFF condition;
   (c) electrically conductive connection means connecting the electrical switch across the PN junction;
   (d) a source of optical radiation of a first wavelength;
   (e) a principal optical fiber having a first end optically coupled to the source by means of a bidirectional optical coupling device, the fiber having a second end optically coupled to the semiconductor body, whereby the fiber and coupling device couple radiation of the first wavelength from the source to the semiconductor body; and (f) a photodetector for detecting light of a second wavelength emitted by the semiconductor body, the photodetector being coupled to the first end of the fiber by means of the coupling device such that radiation of the second wavelength is coupled from the semiconductor body to the photodetector.

6. The system of claim 2 or claim 5 further comprising means for coupling the electrical switch to a primary switch having an ON and an OFF condition, whereby the ON-OFF condition of the electrical switch switches whenever the ON-OFF condition of the primary switch switches, and whereby the controlled terminals of the electrical switch are electrically isolated from the primary switch.

7. The system of claim 2 or claim 5 further comprising:
  (a) a primary switch having an ON and an OFF condition; and
  (b) means coupling the primary switch to the electrical switch, the controlled terminals of the electrical switch being electrically isolated from the primary switch, whereby the ON-OFF condition of the electrical switch switches whenever the ON-OFF condition of the primary switch switches.

8. The system of claim 2 or claim 5 further comprising one or more additional electrical switches, each having an ON and an OFF condition, the connection means further connecting in series with the PN junction the one or more additional switches in series with the electrical switch.

* * * * *